United States Patent [19]
Imai et al.

[11] Patent Number: 5,503,875
[45] Date of Patent: Apr. 2, 1996

[54] FILM FORMING METHOD WHEREIN A PARTIAL PRESSURE OF A REACTION BYPRODUCT IN A PROCESSING CONTAINER IS REDUCED TEMPORARILY

[75] Inventors: Masayuki Imai; Toshiharu Nishimura, both of Kofu, Japan

[73] Assignees: Tokyo Electron Limited, Tokyo; Tokyo Electron Tohoku Limited, Esashi, both of Japan

[21] Appl. No.: 214,109

[22] Filed: Mar. 17, 1994

[30] Foreign Application Priority Data

Mar. 18, 1993 [JP] Japan .................................. 5-084052

[51] Int. Cl.$^6$ .................................................. C23C 16/52
[52] U.S. Cl. ...................... 427/255.3; 427/255.2
[58] Field of Search ........................ 427/248.1, 255.1, 427/255.2, 255.3

[56] References Cited

U.S. PATENT DOCUMENTS

| | | | |
|---|---|---|---|
| 4,279,947 | 7/1981 | Goldman et al. | 427/255.2 |
| 4,395,438 | 7/1983 | Chiang | 427/255.1 |
| 4,699,825 | 10/1987 | Sakai et al. | 427/255.2 |
| 4,992,299 | 2/1991 | Hochberg et al. | 427/255.1 |
| 5,037,775 | 8/1991 | Reisman | 427/588 |
| 5,201,995 | 4/1993 | Reisman et al. | 427/255.1 |
| 5,308,655 | 5/1994 | Eichman et al. | 427/343 |

OTHER PUBLICATIONS

Ohtsuka, N. et al. "A New GaAs on Si Structure Using ALAs Buffer Layers Grown by Atomic Layer Epitaxy"; Journal of Crystal Growth 99 (1990) Jan. Nos. 1/4 pp. 346–353.

Primary Examiner—Terry J. Owens
Attorney, Agent, or Firm—Oblon, Spivak, McClelland, Maier & Neustadt

[57] ABSTRACT

A film is formed on a substrate by supplying a plurality of processing gases into a processing container and forming the film on the substrate from the processing gases while exhausting a portion of the gases out of the processing container. Before a partial pressure of a byproduct in the processing container produced through chemical reaction of the processing gases reaches an equilibrium state, the partial pressure of the byproduct in the processing container is temporarily reduced by temporarily suppressing or stopping the supply of at least one of the processing gases into the processing container and exhausting gas from the processing container.

5 Claims, 4 Drawing Sheets

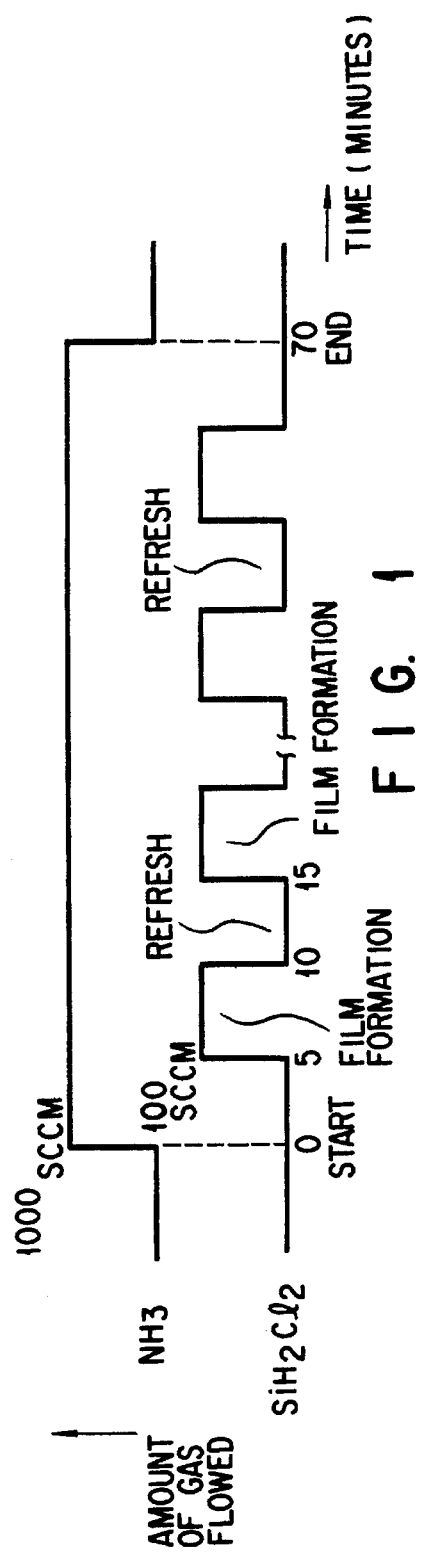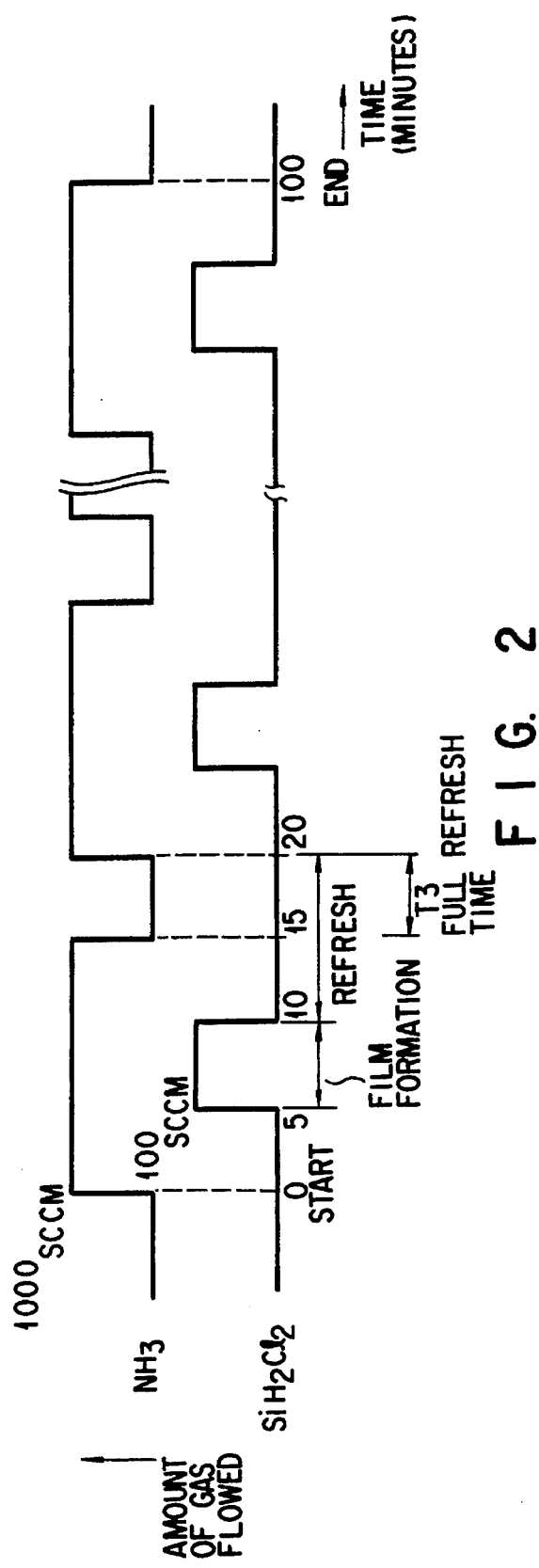

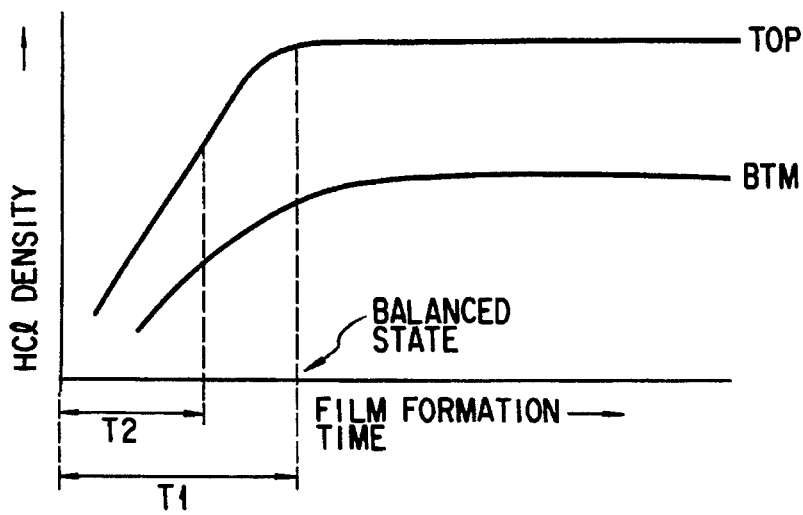
F I G. 4
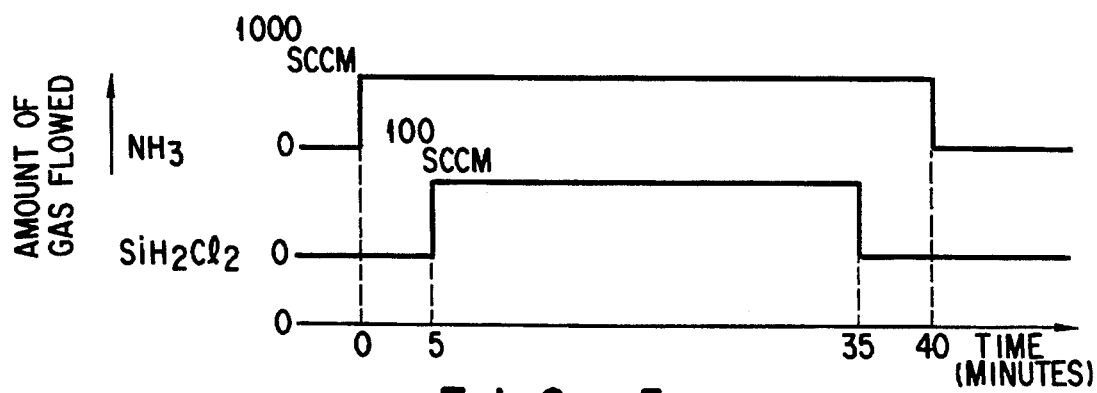
F I G. 5
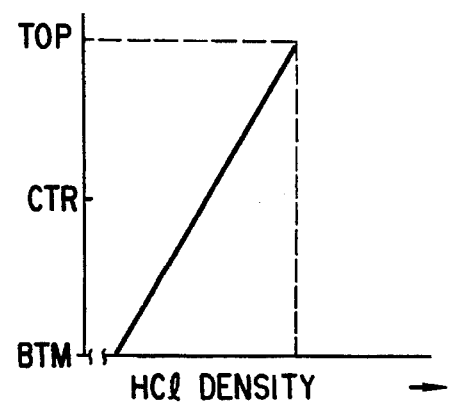
F I G. 6

FILM FORMING METHOD WHEREIN A PARTIAL PRESSURE OF A REACTION BYPRODUCT IN A PROCESSING CONTAINER IS REDUCED TEMPORARILY

BACKGROUND OF THE INVENTION

1. Field of the Invention

The present invention relates to a method for forming a predetermined thin film on the surface of a to-be-processed material.

2. Description of the Related Art

Various methods have been known as the technique for forming a predetermined thin film on the surface of a to-be-processed material. In the process for manufacturing semiconductor devices, for example, a silicon-based thin film, such as silicon nitride or silicon oxide, is formed on a to-be-processed material, such as a semiconductor wafer, many times in view of the necessity to form many micro-miniaturized elements. In this case, in order to not only achieve a higher quantity-production efficiency than a certain production level but also to achieve stabilized characteristics, that is, desired electrical properties, of semiconductor devices (final products), it is required that, during film formation processing, films be uniformly formed, as improved uniform thickness films, across the surfaces of wafers.

The film forming processing is carried out by a processing apparatus, such as a pressure-reduced CVD apparatus. For example, dichlorosilane is used as a processing gas for the formation of a silicon nitride film and a TEOS (tetraethoxy-orthosilane), etc., is used as a processing gas for the formation of a silicon oxide film. In the case where films are formed on wafers by a processing apparatus equipped with a double tube-type upright processing container, a processing gas is introduced from below into an inner tube of a processing container with many wafers placed one above another over a wafer boat. The processing gas flows up from below into the inner tube with a wafer boat placed in the inner tube. As a result, a reaction product is deposited on the surface of the wafer. The processing gas, after reaching the upper area of the processing container, downwardly flows through a space between the inner tube and an outer tube and is exhausted past a gas exhaust system out of the processing container.

Forming a silicon nitride film ($Si_3N_4$) on the surface of the wafer will be explained below by way of example.

In the film forming processing, use is made of two kinds of processing gases, that is, dichlorosilane ($SiH_2Cl_2$) and ammonia ($NH_3$). Through a reaction of dichlorosilane and ammonia given by

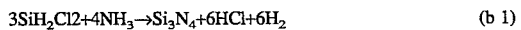

$$3SiH_2Cl_2 + 4NH_3 \rightarrow Si_3N_4 + 6HCl + 6H_2 \quad \text{(b 1)}$$

a silicon nitride film ($Si_3N_4$) is formed on the surface of the wafer.

The sequence of the film forming processing is shown in FIG. 5. As Shown in FIG. 5, for example, ammonia is first flowed in a predetermined quantity, for example, at 1000 SCCM and, after a lapse of 5 minutes, dichlorosilane is flowed in a predetermined quantity, for example, at 100 SCCM for film forming processing to be carried out. During film forming processing, both the gases are continuously flowed and, at the end of one cycle, the supplying of dichlorosilane is first stopped and then the supplying of ammonia is stopped after a lapse of, for example, 5 minutes.

The reason why ammonia is necessarily supplied during the supply of dichlorosilane is because, if dichlorosilane alone is supplied in the absence of ammonia, a different film is deposited on the surface of the wafer through a different reaction.

In this type of method for forming a film through the continuous supply of the processing gas during one cycle, there occurs a gradual rise in a partial pressure of a reaction byproduct not consumed with a passage of a film formation time, that is, a partial pressure of HCl in particular in the case of the above chemical formula (1).

This prevents diffusion of dichlorosilane, a source gas, and adversely affects the uniformity of a film thickness over the surface of the wafer. The adverse effect of the reaction byproduct becomes more prominent toward the downstream (TOP) side than toward an upstream (BTM) side of the gas stream and more prominent toward the center than the marginal edge of the wafer. This is because a reaction in a processing gas is progressed toward the downstream (TOP) side. FIG. 6 shows the density distribution of a reaction byproduct (HCl) produced in a zone from the upstream (bottom) side toward the downstream (TOP) side of the gas stream and FIG. 7 shows the shape of films formed on the wafers at the top (TOP) and bottom (BTM) sides which have been affected by the byproduct. Since the reaction in the processing gas is progressed toward the downstream (TOP) side of the gas stream, the density of the byproduct HCl becomes higher from the bottom side toward the top side of the wafer boat as shown in FIG. 6. For this reason, as shown in FIG. 7, the uniformity of film thickness at the bottom (BTM) side across the surface of a wafer W1 is considerably better but the uniformity of film thickness at the top side across the surface of a wafer W3 is adversely affected because the adverse effect from the byproduct becomes prominent toward the top (downstream) side. This phenomenon markedly appears as the time over which a film is deposited on the wafer becomes longer, that is, the thickness of a film to be deposited becomes greater.

In an experiment for forming, for example, an SiN thin film on the surface of a wafer, a 600 Å-thick and a 1800 Å-thick film were formed on the wafer surface and comparisons were made against data obtained three times for each case. For the 600 Å-thick film, the uniformity of film thickness on the surface of a wafer W3 at a top side was 2.06%, 2.12% and 2.07%, respectively, an average being 2.08%. For the 1800 Å-thick film, on the other hand, the uniformity of film thickness on the surface of a wafer W3 at a TOP side was 2.75%, 2.76% and 2.75%, an average being 2.75%. From this it has been found that a longer film formation time adversely affects the uniformity of film thickness on the wafer surface. It has also been found that even in the case of a 600 Å-thick film thickness, the uniformity of the film thickness over the surface of a wafer W3 at the TOP side was ±2.0% whereas the uniformity of the film thickness over the surface of a wafer W1 at the BTM side was ±1.9% and that the uniformity of the film thickness was adversely affected more toward the TOP side. In the case where a 1800 Å-thick film was formed on the wafer surface, the uniformity of the film thickness of a wafer W3 at the TOP side was ±2.7% whereas the uniformity of the film thickness of a wafer W1 at the BTM side was ±2.1%. The uniformity of the film thickness at the TOP side of the wafer is adversely affected but, compared with the 600 Å-thick film, a difference in the uniformity of the film thickness at the TOP and BTM sides is great.

Various methods may be conceived as a means for computing the uniformity of the film thickness. For example, it may be possible to adopt a method for obtaining a film thickness uniformity value by setting several measuring points on the wafer's film surface and dividing a difference of maximum and minimum ones of these measuring points by double an average thickness at the measuring points. It may be possible to represent the film thickness uniformity value as a standard deviation in the case where a larger number of measuring points are set on the wafer's film surface. In either case, the smaller the film thickness uniformity value the better.

As shown in FIG. 8, at the start of film formation, a film thickness on the wafer surface is greater at the TOP side than at the BTM side, but, as the film formation time progresses, the thickness of the film is reversed and becomes greater at the BTM side than at the TOP side, thus the film thickness becomes nonuniform among the wafer surfaces. The reason for such reversion is because a source gas is adequately diffused at the TOP side in particular due to a lower density of a reaction byproduct at the start of film formation and an amount of film deposition is increased at the TOP side, but, with further progress of film formation, the density of the byproduct becomes greater at the TOP side in particular and the reaction is suppressed at the TOP side.

In order to maintain the uniformity of the film thickness among the wafer surfaces, a temperature gradient at the processing temperature is provided between the BTM side and the TOP side for a target film thickness of, for example, 1000 Å so that the film thickness lines of the bottom and top sides cross as shown in FIG. 8 when the film thickness reaches a level 1000 Å. FIG. 9 shows one form of the temperature gradient at that time. As shown in FIG. 9, when, for example, the film formation temperature is set to 780° C. at the center (CTR) side, the film formation temperature is set to be 770° C. at the bottom side and 800° C. at the top side so as to achieve a uniform film thickness among the wafer surfaces.

When the temperature difference is provided between the bottom side and the top side however a nonuniform film is obtained due to the presence of a different film quality across the wafer surface and, for example, a different etching rate, etc., occurs, thus posing a problem. If nonuniformity occur in the quality of the film, a greater problem arises in the case where, in view of a recent large increase of an integration density, a 64 Mbit D-RAM element for instance is to be manufactured.

In order to solve the nonuniformity of the film thickness among the wafer surfaces, a special gas injection tube, that is, an injector, extending in the length direction of the wafer boat is used in which case a gas is injected from many gas injection holes so as to achieve a uniform gas stream in a zone between the bottom side and the top side. In spite of this means, that structure per se becomes very complex and higher in manufacturing costs add, moreover, the gas injection hole diameters are gradually varied as a result of repeated uses and wastes, thus causing lowered reproducibility.

SUMMARY OF THE INVENTION

It is accordingly the object of the present invention to provide a method for forming a film, which can improve uniformity of a film formed across, and among, the surfaces of to-be-processed materials, while achieving less temperature gradient between a bottom side and a top side of a processing container.

According to the present invention, it is possible to achieve an adequate film forming rate on wafers placed between the top and bottom sides in an upright type processing container at an initial film forming time preceding a balanced state reached through a gradual rise in partial pressure of a reaction byproduct, this being based on the inventor's finding that, at that initial film forming time, there is less adverse effect caused by the reaction byproduct involved. The object of the present invention is achieved by the following film forming method.

That is, a film forming method is provided, comprising:

a processing gas supplying step of supplying at least one kind of processing gas into a processing container with to-be-processed materials located therein; and a thin film forming step of forming a thin film, as a reaction product formed through a chemical reaction in the processing gas, on a surface of the to-be-processed materials in the container, while repeatedly reproducing an initial state of that chemical reaction in the processing gas supplied into the processing container. In the thin film forming step, for example, at the supplying of at least one bind of processing gas into the processing container while exhausting the gas out of the processing container, a normal gas supplying operation and amount-of-gas suppressing operation are alternately carried out, the suppressing operation being made to suppress the amount of processing gas to be supplied by the normal gas supplying operation. In this case, it is required that a time over which the processing gas is normally supplied by one normal supply operation be shorter than a time over which a chemical reaction in the processing gas in the processing container reaches a balanced state.

According to the present invention it is possible to achieve less temperature gradient at a processing temperature between the bottom side wafers and the top side wafers in an upright type processing container and to improve uniformity of a formed film across the surface of the to-be-processed material and among the surfaces of the materials, by repeatedly reproducing an initial state of film formation. That is, according to the present invention, the film is formed by repeatedly effecting the normal processing gas supply and the suppression of the normal processing gas supply in an alternate way. At that time, the initial state of film formation can be maintained and it is possible to suppress an adverse effect as caused by a byproduct of a reaction in the processing gas. Thus there is no appreciable difference in film formation rate on the bottom-side wafers and the top-side wafers, making it possible to improve a uniform film thickness across the surfaces of the to-be-processed materials and among the surfaces of these materials without complicating the construction of the apparatus per se. Further, uniformity can be achieved on the surfaces of the material to be processed with a small temperature gradient, thus ensuring the formation of a film Of uniform quality at the etching rate, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a time chart for explaining a film forming method according to one aspect of the present invention;

FIG. 2 is a time chart for explaining a film forming method according to another aspect of the present invention;

FIG. 4 is a graph for explaining a relation of a film formation time to the density of HCl;

FIG. 5 is a time chart for explaining a conventional film formation method;

FIG. 6 is a graph showing a relation of the density of HCl to the position of a material to be processed;

DETAILED DESCRIPTION OF THE PREFERRED EMBODIMENTS

One embodiment of the present invention will be explained below with reference to the accompanying drawings.

Figure 3:
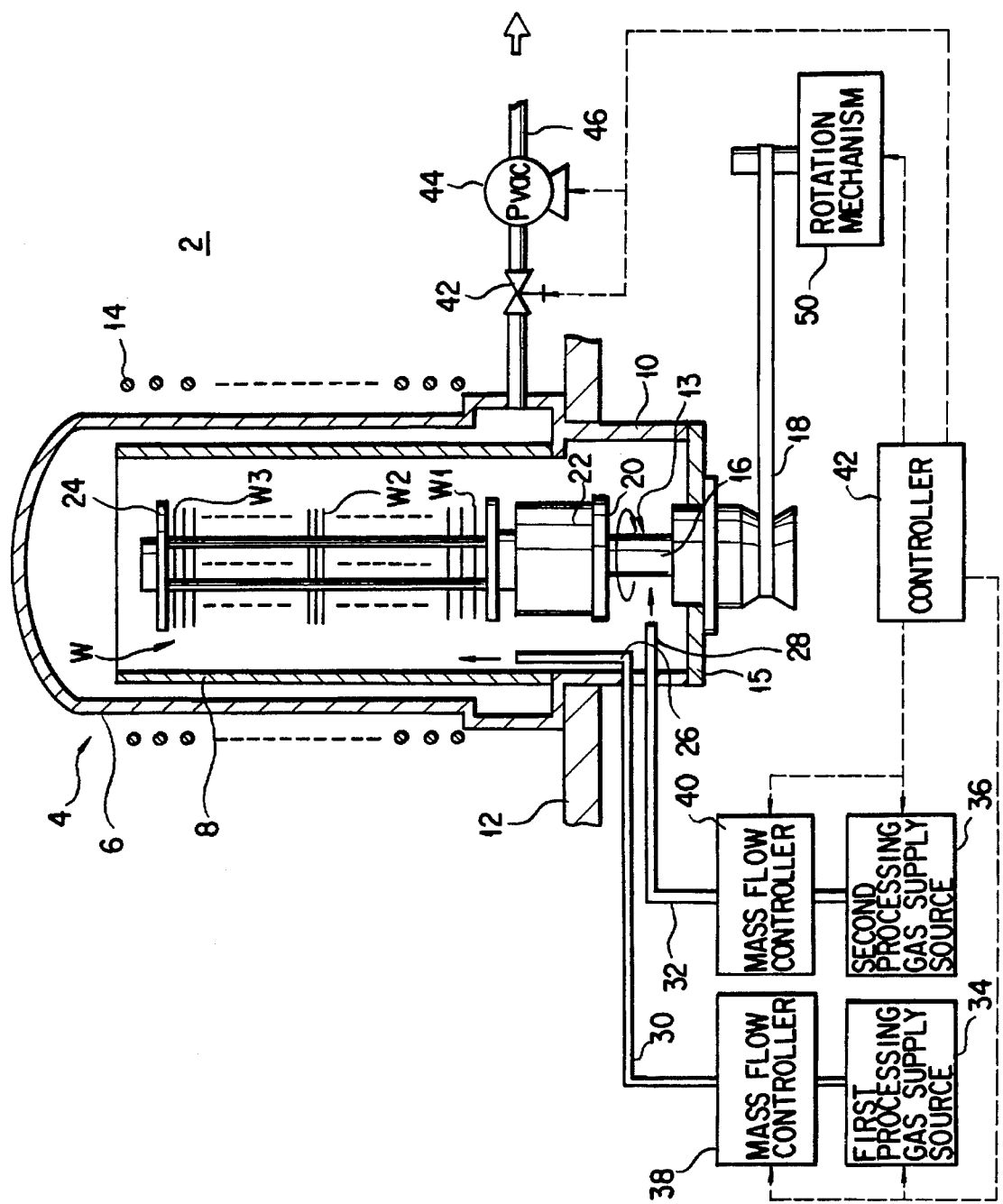
FIG. 3 is a cross-sectional view showing a major portion of an upright type processing apparatus for practicing the method of the present invention.
Figure 7:
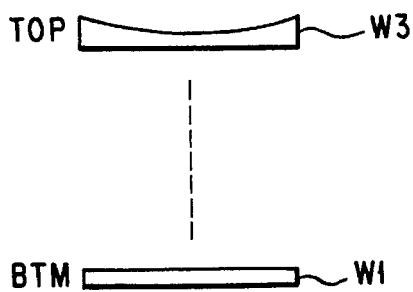
FIG. 7 is an explanative view for explaining a different result of uniformity of a film thickness on those materials to be processed.
Figure 8:
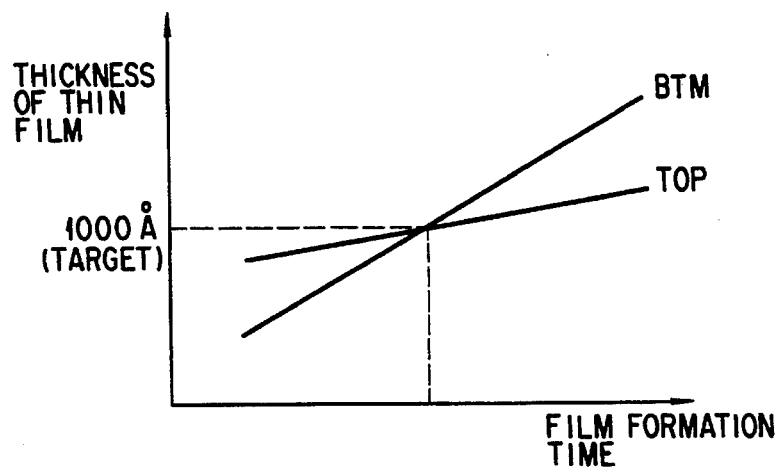
FIG. 8 is a graph showing a relation of a film thickness to a time for film formation at the bottom side and top side of the materials to be processed.
Figure 9:
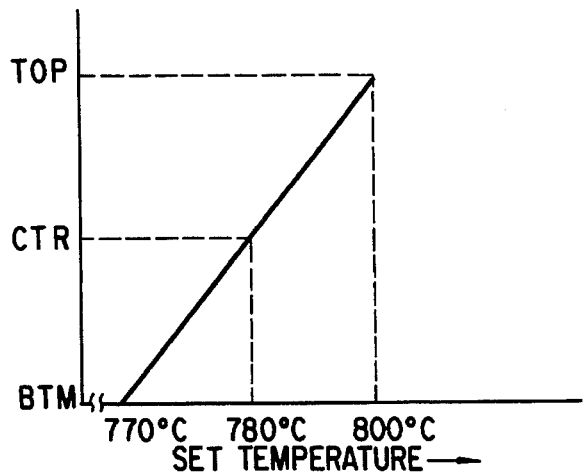
FIG. 9 is a graph showing a temperature gradient at a processing temperature at the bottom side and top side of these materials to be processed.

First, the structure of an upright type processing apparatus used for film forming processing will be explained below. As shown in FIG. 3, an upright type processing apparatus 2 has a cylindrical processing container 4 placed in a substantially vertical direction. The processing container 4 is closed at an upper end and opened at a lower end and comprises a crown-topped outer tube 6 made of a heat-resistance material, such as quartz, and an inner i tube 8 made of, for example, quartz and concentrically so arranged inside the outer tube 6 that it is spaced a predetermined distance away from the outer tube 6. A heater 14 is located around the outside of the processing container 4. In this way, a processing unit is provided.

The outer tube 6 and inner tube 8 are supported at their lower-end side by a manifold 10 made of, for example, stainless and the manifold 10 is fixed to a base plate 12.

Through the opening of the manifold 10 at the lower end side, a wafer boat 24 made of, for example, quartz is loaded from below into the inner tube 8. This loading operation is performed by a liftable mechanism (a boat elevator), not shown, arranged below the processing container 4. Many, for example, 100, to-be-processed materials such as semiconductor wafers W are positioned at a predetermined equal pitch on the wafer boat. The wafer boat 24 is supported over a support section 13 equipped with a rotation shaft 16 with a heat retaining cylinder 22 therebetween and loaded, together with the support section 13, into the processing container 4 by means of the liftable mechanism. With the wafer boat 24 set in a predetermined position in the processing container 4, a disc-like cap member 15 made of, for example, stainless and mounted on the support section 13 is hermetically sealed to the lower open end of the manifold 10 with an O ring, not shown, set therebetween. The rotation shaft 16 extends through the central area of the cap member 15 such that it can be rotated in a gas-tight state hermetically sealed by, for example, a magnetic fluid. The lower end portion of the rotation shaft 16 is connected by a rotation belt 18 to a rotation mechanism 50. A turntable 20 made of, for example, steel is fixed to the upper end of the rotation shaft 11. That is, the wafer boat 24 is mounted over the turntable 20 with the heat retaining cylinder 22 set therebetween.

Of the wafers W placed on the wafer boat 24, those wafers at the lower-end side, those at the middle area and those at the top-end side are referred to as the bottom (BTM) side wafer W1, middle area (CTR) side wafers W2 and top (TOP) side wafers W3, respectively, in the present embodiment.

First and second processing gas introducing nozzles 26 and 28 are provided air-tightly at the lower side of the manifold 10 in such a manner as to extend through the wall of the manifold 10. The first nozzle 26 is made of, for example, a quartz and bent in a L-shape along the wafer boat 24. The nozzles 26 and 28 are connected by gas supply pipes 30 and 32 to first and second processing gas supply sources 34 and 36, respectively. Further, flow control valves, such as mass flow controllers 38 and 40, are interposed at the gas supply pipes 30 and 32 so as to control an amount of gas flowing through the gas supply pipes 30 and 32. The mass flow controllers 38 and 40 are controlled by a controller 42 comprised of, for example, a microcomputer for controlling the operation of the processing apparatus as whole.

According to the present embodiment, dichlorosilane and ammonia are used as a processing gas so as to form a silicon nitride film on the surface of the wafer W. As the processing gas, dichlorosilane and ammonia are filled in the first and second processing gas supply sources 34 and 36, respectively. The manifold 10 is connected to a vacuum exhaust pipe 46 via an open/close valve 42 and vacuum pump 44 so that a vacuum can be drawn in the processing container 4. The operations of the open/close valve 12 and vacuum pump 44 as well as the operation of the rotation mechanism, are controlled by the controller 42.

Forming a silicon nitride film on the surface of the wafer W using the processing apparatus thus arranged will be explained below.

At the start of a film forming time, as shown in FIG. 4, a reaction by product, HCl, has its density brought to an increasing level and not balanced at the bottom and top sides in the processing container 4, thus being less affected by the byproduct, HCl. Therefore, the film formation reaction is governed by a favorable reaction rate and it is possible to obtain a sufficient film formation rate not only at the bottom side but also at the top side. The inventors pay specific attention to this aspect and the uniformity of film thickness is achieved by repeatedly realizing an initial film formation state less affected by the reaction byproduct, HCl.

In an ordinary processing apparatus a time T1 over which the reaction byproduct reaches a balanced state is a few tenths of minutes and, according to the present embodiment, a still shorter initial reaction time T2 is set to be, for example, about 5 minutes on the basis of which repetitions are carried out.

According to the present embodiment, the wafers W on the wafer boat 24 are loaded into the processing container 4 heated by the heater 14. Then dichlorosilane and ammonia are supplied as the source gas into the container 4 from the gas supply sources 34 and 36, thus starting the film forming processing. During one cycle over which a film formation is complete, the wafer boat 24 is rotated by the rotation shaft 16 at an equal speed while a vacuum in the container 4 is created through vacuum suction by the vacuum pump 44.

The processing gas introduced into the container 4 via the nozzles 26 and 28 ascends at the wafer area while being contacted with the respective wafers W within the inner tube 8. The processing gas, reaching the ceiling of the container 4, is flowed down a spacing between the inner tube 8 and the outer tube 6 and exhausted through the vacuum exhaust tube 46.

According to the present embodiment, in order to provide silicon nitride ($Si_3N_4$), $NH_3$ and $SiH_2Cl_2$ are supplied into the container at 1000 SCCM and 100 SCCM, respectively, and a film formation temperature prevalent at the central area of the processing zone is set at 780° C. at a container's internal pressure of 0.5 Torrs and an about 1000 Å-thick film is grown on the surfaces of the wafers.

As shown in FIG. 1, at the start of processing, an ammonia gas alone starts to be supplied in a given amount (1000 SCCM) into the container 4 and the supplying of dichlorosilane is stopped at that time. After a lapse of a predetermined time, for example, 5 minutes, dichlorosilane is also supplied at a steady state into the container 4 in a predetermined quantity (100 SCCM) for film formation processing. After the dichlorosilane has been supplied over a predetermined time, for example, 5 minutes, the supplying of this material is suppressed. In the case of the present embodiment, the supplying of dichlorcsilane is completely stopped, noting that, in this state of stopping, ammonia is being supplied continuously into the container 4. When this state of stopping is continued over a predetermined time, for example, 5 minutes, dichlorosilane is again supplied into the container 4 for film growth. In this way, the steady supplying and suppressing or stopping of the dichlorosilane are alternately carried out over a predetermined time, for example, 5 minutes, that is, the supplying of the dichlorosilane is carried out intermittently for film growth.

The supplying of the dichlorosilane is thus effected in an intermittent way such that, during the time over which the Supplying of the dichlorosilane is stopped, a byproduct produced through a film formation reaction at a preceding step is positively exhausted out of the exhaust pipe 46 so that the density of the byproduct is lowered in the container, that is, the inside of the container 4 is refreshed. Restarting the supplying of dichlorosilane brings the inside of the container back to the initial state of film formation and fence a film growth is restarted. Stated in another way, the state at the initial reaction time T2 as shown in FIG. 4 is repeatedly reproduced and, until the film formation is complete (for example, 70 minutes), it is possible to repeat the film formation proceeding in such a state as to be less affected by the reaction byproduct. Since the source gas is adequately diffused not only at the bottom side but also at the top side without being inhibited by the byproduct, it is possible to achieve a substantially uniform, better film formation rate at all the wafers W1 to W3 from the bottom side to the top side, that is, it is possible to perform uniform, better film formation processing across the surfaces of the wafers and among the surfaces of the wafers.

In the conventional apparatus, a temperature gradient has been set between the bottom side wafers and the top side wafers so as to obtain a uniform film thickness among the surfaces of the wafers, while, according the present embodiment, a uniform film thickness can be adequately achieved among the surfaces of the wafers by repeatedly performing film forming steps less affected by the reaction byproduct so that it is only necessary to set the temperature gradient to a zero or a small extent (a temperature difference). It is, therefore, possible to perform film forming processing at a uniform temperature and to achieve formation of a uniform-quality film through the use of, for example, a uniform etching rate.

When the film forming processing was performed using such a method, the uniformity of the film thickness across the surface of the wafer revealed an about ±0.5% to ±1% improvement over ±2.75% for 1800 Å and ±2.08% for 600 Å in the conventional case. Even the temperature gradient involved was able to be about ±10° C. at the processing temperature of 780° C. and film thickness of 1000 Å as compared against ±15° C. in the conventional case. In the present embodiment, the film forming time as well as the refresh time over which the supplying of dichlorosilane is stopped, is set in units of five minutes, but the film forming time has only to be properly selected in a time range involved until the density of the byproduct is balanced, for example, about 1 to 10 minutes. Further the refresh time is not restricted to this value, but it is desirable to perform a refresh operation by a time length over which, for example, the gas in the container 4 is nearly completely replaced by ammonia.

The reason why ammonia is flowed into the container, only for a predetermined time, prior to supplying dichlorosilane and after the supplying of the dichlorosilane has been completely stopped is because a different-quality film is formed on the wafer surface when the dichlorosilane is introduced in the absence of ammonia as set out above. According to the present invention, it is possible to prevent formation of such a film.

In the present invention, ammonia is continuously flowed until the film forming processing is complete, but the present invention is not restricted thereto. As shown, for example, in FIG. 2, a full refresh time T3 (for example, 5 minutes) over which the supplying of the ammonia is completely stopped may be set in an intermittent way. Even in this case the ammonia is flowed about 5 minutes before and after the dichlorosilane is supplied, so as to prevent formation of a different-quality film. Further, during the full refresh time T3, the inside of the container 4 can be vacuum-drawn to the base pressure of the vacuum pump 44, such as about 4 to $5 \times 10^{-3}$ Torrs. According to this method, a somewhat longer time is requited until the formation of the film is complete. Since, however, a reaction byproduct can be fully exhausted so that an adverse effect can be almost completely suppressed, it is possible to more uniformly improve a film thickness across the surfaces of the wafers and among the surfaces of the wafers.

Although, in the present embodiment, two kinds of processing gases have been explained as being used for the formation of a silicon nitride film, the present invention can naturally be applied to the case where, for example, an $SiO_2$ film is formed using one kind of processing gas, such as TEOS. In this case, alcohol is produced as a reaction byproduct, but it is possible to suppress a resultant adverse effect. Further, the present invention can also be applied to the formation of a silicon oxide film using monosilane and nitrous oxide gas.

The time over which an amount of processing gas supplied is extremely suppressed may be intermittently set, without completely stopping the supply of the processing gas, so as to reduce an adverse effect resulting from a reaction byproduct involved. The film forming method of the present invention can be applied not only to an upright type heat treating apparatus but also to a horizontal type processing apparatus, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for creating a film-formation processing atmosphere, comprising the steps of:

providing a film on a substrate in a processing container by supplying a plurality of processing gases into the processing container and forming the film from the processing gases on a surface of the substrate while exhausting a portion of the gases out of the processing container at all times; and before a partial pressure of a byproduct in the processing container produced through a chemical reaction of the processing gases reaches an equilibrium state, performing a partial pressure reducing step which temporarily reduces the partial pressure of the byproduct in the processing container.

2. The method according to claim 1, wherein the partial pressure reducing step is intermittently performed until the film formation on the substrate is completed.

3. The method according to claim 1, wherein the partial pressure reducing step is performed by temporarily suppressing the supply of at least one of the processing gases into the processing container and exhausting gas from the processing container.

4. The method according to claim 3, wherein the suppression of the supply of at least one of the processing gases in the partial pressure reducing step includes stopping the supply of the at least one processing gas.

5. The method according to claim 1, wherein the supply of all the processing gases into the processing container is stopped temporarily, after the partial pressure reducing step.

* * * * *